United States Patent
Kim et al.

(10) Patent No.: US 9,831,245 B1
(45) Date of Patent: Nov. 28, 2017

(54) COMPLEMENTARY LOGIC DEVICE USING SPIN-ORBIT INTERACTION DIFFERENCE AND METHOD FOR MANUFACTURING THE SAME

(71) Applicant: KOREA INSTITUTE OF SCIENCE AND TECHNOLOGY, Seoul (KR)

(72) Inventors: Hyung-Jun Kim, Seoul (KR); Hyun Cheol Koo, Seoul (KR); Chaun Jang, Seoul (KR); Hansung Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/416,859

(22) Filed: Jan. 26, 2017

(30) Foreign Application Priority Data

Sep. 6, 2016 (KR) .................. 10-2016-0114295

(51) Int. Cl.
*H01L 21/28* (2006.01)
*H01L 29/66* (2006.01)
(Continued)

(52) U.S. Cl.
CPC ...... *H01L 27/092* (2013.01); *H01L 21/28291* (2013.01); *H01L 21/823807* (2013.01);
(Continued)

(58) Field of Classification Search
None
See application file for complete search history.

(56) References Cited

U.S. PATENT DOCUMENTS 7,411,235 B2    8/2008  Saito et al.
7,439,770 B2   10/2008  Kim et al.
(Continued)

FOREIGN PATENT DOCUMENTS

| JP | 60-107918 A | 6/1985 |
| KR | 10-0682967 B1 | 2/2007 |
| KR | 10-1084020 B1 | 11/2011 |

OTHER PUBLICATIONS

Koo, H., et al., "Control of spin precession in a spin-injected filed effect transistor," Science vol. 325.5947, 2009 (pp. 1515-1518).
(Continued)

*Primary Examiner* — Asok K Sarkar
*Assistant Examiner* — Grant Withers
(74) *Attorney, Agent, or Firm* — NSIP Law

(57) ABSTRACT

A complementary logic device includes i) a substrate, ii) a first semiconductor device located on the substrate and including a first channel layer, a carrier supply layer for supplying a carrier to the channel layer, and an upper cladding layer and a lower cladding layer respectively located at upper and lower portions of the channel layer, iii) a second semiconductor device located on the substrate and including a structure the same or similar to that of the first semiconductor device, iv) a source electrode located on the two semiconductors and made of a ferromagnetic body, v) a drain electrode located on the two semiconductors and made of a ferromagnetic body, and vi) a gate electrode located on the two semiconductors and located between the two electrodes so that a gate voltage is applied thereto to control a spin of electrons passing through the two channel layers.

13 Claims, 4 Drawing Sheets

(51) Int. Cl.
    *H01L 27/092* (2006.01)
    *H01L 21/8238* (2006.01)
    *H01L 29/778* (2006.01)
    *H01L 29/36* (2006.01)

(52) U.S. Cl.
    CPC ........ *H01L 29/36* (2013.01); *H01L 29/66462* (2013.01); *H01L 29/66984* (2013.01); *H01L 29/7786* (2013.01)

(56) References Cited

U.S. PATENT DOCUMENTS

| | | | |
|---|---|---|---|
| 8,183,611 B2 | 5/2012 | Kim et al. | |
| 8,629,427 B2 | 1/2014 | Banerjee et al. | |
| 9,087,889 B2 | 7/2015 | Nakajima et al. | |
| 9,202,906 B2 | 12/2015 | Howell et al. | |
| 9,214,517 B2 | 12/2015 | Jeon et al. | |
| 2010/0084633 A1* | 4/2010 | Kim ................. | H01L 29/66984 257/24 |
| 2011/0042648 A1* | 2/2011 | Koo ................. | H01L 29/66984 257/24 |
| 2013/0140606 A1* | 6/2013 | Koo ................. | H01L 29/66984 257/195 |
| 2014/0264514 A1* | 9/2014 | Koo ................. | H01L 29/66984 257/295 |

OTHER PUBLICATIONS

Matsunaga, S., et al., "Fabrication of a nonvolatile full adder based on logic-in-memory architecture using magnetic tunnel junctions," Applied Physics Express, vol. 1.9, 2008 (3 pages).

\* cited by examiner

COMPLEMENTARY LOGIC DEVICE USING SPIN-ORBIT INTERACTION DIFFERENCE AND METHOD FOR MANUFACTURING THE SAME

CROSS-REFERENCE TO RELATED APPLICATION

This application claims priority to Korean Patent Application No. 10-2016-114295, filed on Sep. 6, 2016, and all the benefits accruing therefrom under 35 U.S.C. §119, the contents of which in its entirety are herein incorporated by reference.

BACKGROUND

1. Field

Embodiments relate to a complementary logic device and a method for manufacturing the same. In more detail, embodiments relate to a complementary logic device using semiconductor devices which have different spin-orbit interaction constants and also use a two-dimensional electron gas (2DEG) structure or a two-dimensional hole gas (2DHG) structure as a channel layer, and a method for manufacturing the same.

[Description about National Research and Development Support]

This study was supported by the R&D Project of National Research Foundation of Korea (Project Name. Development of III-V compound semiconductors MOSFET technology on silicon substrate by using transfer printing and strain engineering, Project No. 1711037587) under the superintendence of Ministry of Science, ICT and Future Planning, Republic of Korea.

2. Description of the Related Art

Recently, devices using not only charge properties of electrons but also spin properties are being actively studied. This is called spintronics. A representative spin device is a spin transistor whose concept has been introduced in 1990 by Datta and Das, and the spin transistor has the limelight as a high-speed, non-volatile, low-power and high-integration device. Recently, logic devices based on such a spin transistor are being actively studied.

As a logic circuit, a logic circuit using a complementary logic device (or, a complementary device) is representative. An existing silicon-based complementary metal-oxide (CMOS) transistor is operated by preparing a p-channel MOS transistor and an n-channel MOS transistor and then controlling carriers in a semiconductor by means of an electric field. The complementary logic device has advantages in rapid switching speed and low power consumption. However, there is a limit in reducing a size of the existing silicon-based complementary transistor, and the heating problem becomes more serious due to a small design.

A complementary logic device using a spin transistor implements a complementary logic operation by using two spin transistors with different spin-orbit interaction constants to serve as a p-MOS and an n-MOS of an existing silicon-based CMOSFET. Essential components of the spin transistor include a ferromagnetic body, a semiconductor channel and an oxide film for a gate. One of two ferromagnetic bodies located at both ends of the semiconductor channel plays a role of injecting spin-polarized electrons into the semiconductor channel, and the other one plays a role of detecting spin-polarized electrons passing through the semiconductor channel by means of precession. The semiconductor channel uses a 2DEG or 2DHG structure in order to utilize the Rashba effect, and the spin-polarized electrons move toward a quantum well (channel) layer in the 2DEG or 2DHG structure. At this time, if there is an electric field (E) perpendicular to a wave vector (k) of the moving electron, a magnetic field is generated by means of spin-orbit interaction as $H_{Rashba} \propto k \times E$. In this Rashba effect, if electrons flow in an x direction and an electric field is applied in a z direction by means of structural inversion asymmetry, a resulting magnetic field induced by the spin-orbit interaction is generated in a y direction. The spin injected into the channel with a 2DEG or 2DHG structure causes precession by means of this magnetic field, and a precession angle is controlled by means of the gate voltage.

In order to perform a complementary logic operation like an inverter by using the spin transistor, two 2DEGs or 2DHGs having different spin-orbit interaction constants should be controlled using a single gate. However, if only an existing thin film deposition technique is employed, it is impossible to fabricate 2DEG or 2DHG structures with different spin-orbit interaction constants on a single substrate. The present disclosure is directed to overcoming this limit and providing a method for manufacturing a spin-based complementary logic device.

SUMMARY

An aspect of the present disclosure is directed to providing a complementary logic device using 2DEGs or 2DHGs with different spin-orbit interaction constants. In particular, the present disclosure is directed to providing a method for manufacturing the complementary logic device by arranging 2DEG or 2DHG structures with different spin-orbit interaction constants on a single substrate and controlling the spin-orbit interaction constants simultaneously by using a single gate.

A complementary logic device according to an embodiment comprises: a substrate; a first semiconductor device located on the substrate and including a first channel layer with a two-dimensional electron gas structure (2DEG) or a two-dimensional hole gas structure (2DHG), a carrier supply layer for supplying a carrier to the channel layer, and an upper cladding layer and a lower cladding layer respectively located at upper and lower portions of the channel layer; a second semiconductor device located on the substrate to be spaced apart from the first semiconductor device and including a second channel layer with a two-dimensional electron gas structure (2DEG) or a two-dimensional hole gas structure (2DHG), a carrier supply layer for supplying a carrier to the channel layer, and an upper cladding layer and a lower cladding layer respectively located at upper and lower portions of the channel layer; a source electrode located on the first semiconductor device and the second semiconductor device and made of a ferromagnetic body; a drain electrode located on the first semiconductor device and the second semiconductor device to be spaced apart from the source electrode and made of a ferromagnetic body; and a gate electrode located on the first semiconductor device and the second semiconductor device and located between the source electrode and the drain electrode so that a gate voltage is applied thereto to control a spin of electrons passing through the first channel layer and the second channel layer.

The first semiconductor device and the second semiconductor device may respectively include a first carrier supply layer located below the lower cladding layer to supply a carrier to the channel layer and a second carrier supply layer located on the upper cladding layer to supply a carrier to the channel layer, the lower cladding layer may include a first lower cladding layer and a second lower cladding layer formed below the first lower cladding layer and having a greater bandgap than the first lower cladding layer, and the upper cladding layer may include a first upper cladding layer and a second upper cladding layer formed on the first upper cladding layer and having a greater bandgap than the first upper cladding layer.

A doping type of the first carrier supply layer of the first semiconductor device may be different from a doping type of the first carrier supply layer of the second semiconductor element, or a doping type of the second carrier supply layer of the first semiconductor device may be different from a doping type of the second carrier supply layer of the second semiconductor element.

A doping concentration of the first carrier supply layer of the first semiconductor device may be different from a doping concentration of the first carrier supply layer of the second semiconductor element, or a doping concentration of the second carrier supply layer of the first semiconductor device may be different from a doping concentration of the second carrier supply layer of the second semiconductor element.

A doping characteristic of the first carrier supply layer of the first semiconductor device may be different from a doping characteristic of the first carrier supply layer of the second semiconductor element, or a doping characteristic of the second carrier supply layer of the first semiconductor device may be different from a doping characteristic of the second carrier supply layer of the second semiconductor element.

The first semiconductor device and the second semiconductor device respectively include one or more carrier supply layers, and the first semiconductor device and the second semiconductor device include different numbers of carrier supply layers.

The carrier supply layer of the first semiconductor device may be located on the first channel layer, and the carrier supply layer of the second semiconductor device may be located below the second channel layer.

A thickness of the upper cladding layer of the first semiconductor device may be different from a thickness of the upper cladding layer of the second semiconductor element, or a thickness of the lower cladding layer of the first semiconductor device may be different from a thickness of the lower cladding layer of the second semiconductor element.

The first channel layer and the second channel layer may be made of a material selected from the group consisting of GaAs, InAs, InGaAs and InSb, and the first channel layer and the second channel layer may be made of different materials.

The providing of a first semiconductor device may include: forming the first semiconductor device on a second substrate which is different from the first substrate used for manufacturing the complementary logic device; and separating the first semiconductor device from the second substrate and transferring onto the first substrate.

The providing of a second semiconductor device may include: forming the second semiconductor device on a third substrate which is different from the first substrate used for manufacturing the complementary logic device; and separating the second semiconductor device from the third substrate and transferring onto the first substrate.

In the providing of the complementary logic device, the first channel layer and the second channel layer may be made of a material selected from the group consisting of GaAs, InAs, InGaAs and InSb, and the first channel layer and the second channel layer may be made of different materials.

According to the embodiments, it is possible to implement a high-speed, non-volatile, low-power complementary logic device by using a single gate electrode on a single substrate by means of a first semiconductor device and a second semiconductor device with different spin-orbit interaction constants.

DETAILED DESCRIPTION

Figure 1:
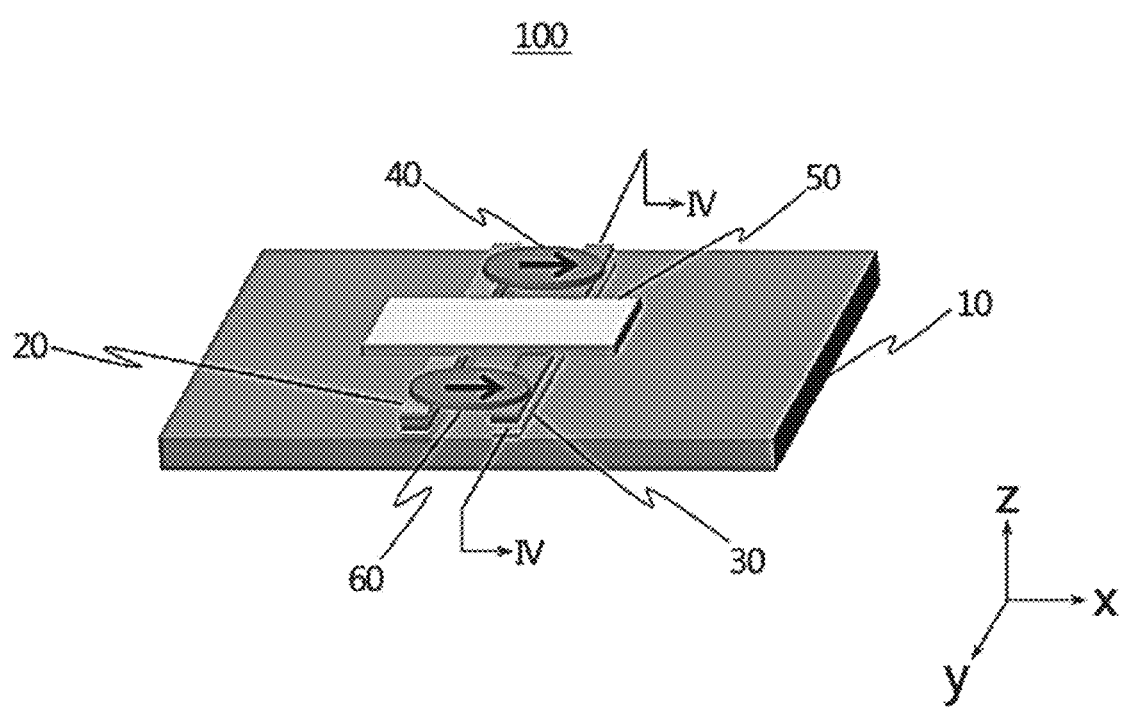
FIG. 1 is a schematic perspective view showing a complementary logic device according to an embodiment of the present disclosure.

In case it is mentioned that any component is located "on" another component, the component may be located directly on another component, or any other component may be interposed between them. However, if it is mentioned that any component is located "directly on" another component, no other component is interposed between then.

Terms "first", "second", "third" or the like are used for explaining various components, ingredients, areas, layers and/or sections, without being limited thereto. These terms are just used for distinguishing any component, ingredient, area, layer or section from another. Therefore, any "first component, ingredient, area, layer or section" recited below may also be mentioned as a "second component, ingredient, area, layer or section" without departing from the scope of the present disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the term "includes" when used in this specification, specifies the presence of stated features, regions, integers, steps, operations, elements, and/or components, but does not preclude the presence or addition of one or more other features, regions, integers, steps, operations, elements, components, and/or groups thereof.

Terms such as "above" and "below" representing relative spaces may be used for explain a relation between two components more easily on the drawings. These terms are intended to include not only features as depicted in the drawings but also features or operations in an actual use. For example, if a device is overturn on the drawing, any components which have been described as being "below" other components may be explained as being "above" other components in the overturn state. Therefore, the term "below" may include both an upper direction and a lower direction.

A device may rotate by 90 degrees or another angle, and the terms representing relative spaces should be interpreted accordingly.

Unless otherwise defined, all terms including technical and scientific terms used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, an embodiment of the present disclosure will be described with reference to the accompanying drawings so as to be easily implemented by those having ordinary skill in the art. However, the present disclosure may be modified in various ways without being limited to the embodiment.

FIG. 1 schematically shows a complementary logic device 100 according to an embodiment of the present disclosure. The structure of the complementary logic device 100 of FIG. 1 is just an illustration of the present disclosure, and the present disclosure is not limited thereto. Therefore, the complementary logic device 100 may be modified in various ways.

As shown in FIG. 1, the complementary logic device 100 includes a substrate 10, semiconductor devices 20, 30, a source electrode 40, a gate electrode 50 and a drain electrode 60. In addition, the complementary logic device 100 may further include other components as necessary.

The substrate 10 includes silicon and a silicon oxide formed thereon. By using silicon which is broadly used as a material of a semiconductor, the substrate 10 may be prepared at low cost. In addition, the substrate 10 may also include a flexible substrate.

The semiconductor devices 20, 30 include a first semiconductor device 20 and a second semiconductor device 30. Here, the first semiconductor device 20 may be used as an electron transfer passage, and the second semiconductor device 30 may be used as a hole transfer passage. In other words, the first semiconductor device 20 may be used as a two-dimensional electron gas (2DEG) structure, and the second semiconductor device 30 may be used as a two-dimensional hole gas (2DHG) structure. In another embodiment, the first semiconductor device 20 and the second semiconductor device 30 may be simultaneously used as a 2DEG structure or a 2DHG structure. However, the semiconductor devices used as the first semiconductor device 20 and the second semiconductor device 30 should have different inherent spin-orbit interaction constants.

The source electrode 40 is located on the semiconductor devices 20, 30, and the source electrode 40 and the drain electrode 60 are placed opposite to each other with the gate electrode 50 therebetween. The source electrode 40 and the drain electrode 60 are spaced apart from the gate electrode 50 by the same distance. A signal input from the source electrode 40 flows along the semiconductor devices 20, 30 serving as channels, and is output to the drain electrode 60 according to a regulation signal from the gate electrode 50. Hereinafter, a manufacturing method capable of controlling spin-orbit interaction constants of the first semiconductor device 20 and the second semiconductor device 30, respectively, will be described with reference to FIGS. 2 and 3.

Figure 2:
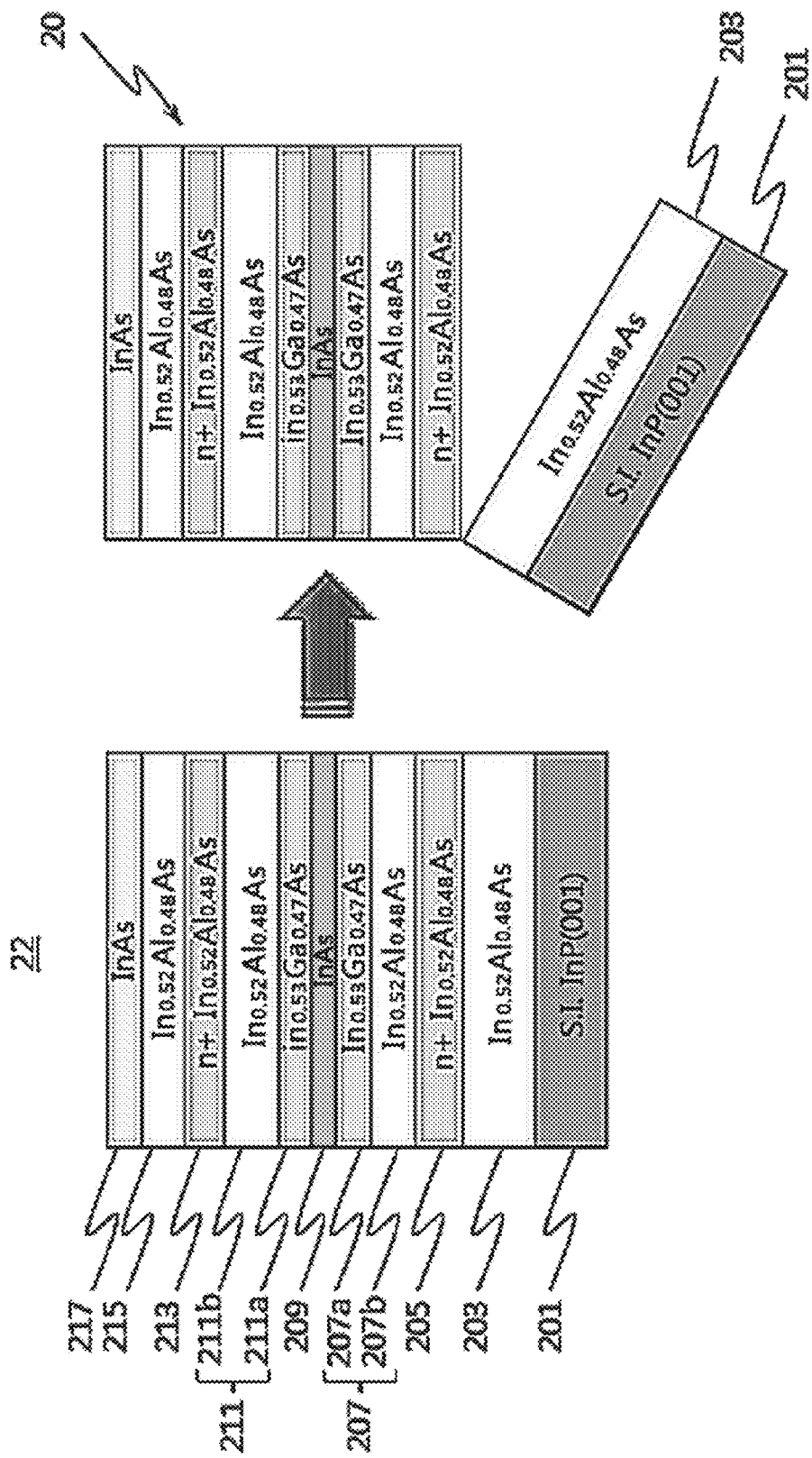
FIG. 2 is a schematic diagram for illustrating a process of manufacturing a first semiconductor element, included in the complementary logic device of FIG. 1.

FIG. 2 schematically shows a manufacturing process of the semiconductor device 20 depicted in FIG. 1. A left portion of FIG. 2 shows a preform 22 of the semiconductor device 20 prepared by means of a semiconductor process, and a right portion of FIG. 2 shows a process of separating the semiconductor device 20 from the preform 22. The manufacturing process of the semiconductor device 20 of FIG. 2 is just for illustrating the present disclosure, and the present disclosure is not limited thereto. Therefore, the manufacturing process of the semiconductor device 20 of FIG. 2 may also be modified in various ways.

As shown in FIG. 2, the first semiconductor device 20 is manufactured from the preform 22. The preform 22 includes an InAlAs buffer layer 203, an n-doped InAlAs first carrier supply layer 205, an undoped InGaAs/InAlAs lower cladding layer 207, an InAs channel layer 209, an undoped InAlAs/InGaAs upper cladding layer 211, and an n-doped InAlAs second carrier supply layer 213, laminated on a semi-insulating InP substrate 201 in order. An InAlAs layer 215 is formed on the n-doped InAlAs second carrier supply layer 213, and an InAs capping layer 217 is formed thereon.

As shown in FIG. 2, the lower cladding layer 207 and the upper cladding layer 211 respectively have a dual cladding structure made of an undoped InGaAs layer and an InAlAs layer. In other words, the lower cladding layer 207 includes a first lower cladding layer 207a made of undoped InGaAs and a second lower cladding layer 207b formed therebelow and made of undoped InAlAs. In addition, the upper cladding layer 211 includes a first upper cladding layer 211a made of undoped InGaAs and a second upper cladding layer 211b formed thereon and made of undoped InAlAs. The second lower cladding layer 207b has a greater energy bandgap than the first lower cladding layer 207a, and the second upper cladding layer 211b has a greater energy bandgap than the first upper cladding layer 211a.

The InAs channel layer 209 forms a quantum wall by means of energy barriers of the lower cladding layer 207 and the upper cladding layer 211. In particular, carriers are confined in the channel layer 209 by means of the lower cladding layer 207 and the upper cladding layer 211 so that the channel layer 209 forms a two-dimensional electron gas (2DEG) with high electron mobility. Even though FIG. 2 illustrates that InAs is used as a material of the channel layer 209, GaAs, InGaAs or InSb may also be used. In addition, the cladding structure may be used as a single structure, instead of the dual structure. In other words, the InAlAs layer may be used as a cladding layer, and the InGaAs layer may be used as a channel layer. In this case, the InGaAs channel layer has a two-dimensional electron gas structure.

The InAlAs buffer layer is formed to relieve lattice mismatch between the semi-insulating InP substrate and a layer growing thereon, and later, the InAlAs buffer layer is used as a sacrificial layer before the semiconductor device is attached onto the substrate. All layers other than the InAs channel layer 209 may have the same lattice constant as the InP substrate 201. The InAs capping layer 217 prevents oxidation and denaturalization of the semiconductor, which may occur due to the exposure to an atmosphere in a stand-by state after the semiconductor substrate is fabricated.

The first carrier supply layer 205 made of n-doped InAlAs for supplying a carrier to the channel layer 209 of two-dimensional electron gas is located below the lower cladding layer 207. The second carrier supply layer 213 is located on the upper cladding layer 211. If a dual structure having carrier supply layers of different doping types in which the carrier supply layers 205, 213 of different doping types are provided at upper and lower portions of the channel layer 209 is used, a potential gradient at a channel of the spin transistor further increases in comparison to a single carrier supply layer structure, thereby improving spin-orbit interaction. Here, the single carrier supply layer structure means that the carrier supply layer is provided only at an upper or lower portion of the channel layer.

The carrier supply layers 205, 213 of different doping types may be disposed at upper and lower portions of the channel layer 209 so that the energy band structure and electron distribution of the channel layer 209 become more asymmetric, which may increase a spin-orbit interaction constant of the first semiconductor element. In particular, by adjusting doping concentrations of the first carrier supply layer 205 and the second carrier supply layer 213, asymmetry of the energy band structure and electron distribution in the channel layer 209 may be increased. Due to the increase of asymmetry, the potential gradient at the channel 209 may become greater, and the spin-orbit interaction may be further increased. In addition, in order to increase the asymmetry of the energy band structure and electron distribution of the channel layer 209, the upper cladding layer 211 and the lower cladding layer 207 may have different thicknesses. In addition, in order to increase the asymmetry of the energy band structure and electron distribution of the channel layer 209, the first upper cladding layer 211a and the first lower cladding layer 207a may have different thicknesses. Meanwhile, even though FIG. 2 shows that the second carrier supply layer 213 is delta-doped and the first carrier supply layer 205 is bulk-doped, they may be doped by any one of the bulk doping and the delta doping. For example, the first carrier supply layer 205 below the lower cladding layer 207 may be an n-delta-doped layer, and the second carrier supply layer 213 disposed on the upper cladding layer 211 may be an n-bulk-doped InAlAs layer. In addition, even though FIG. 2 depicts that both of the first carrier supply layer 205 and the second carrier supply layer 213 are n-doped layers, any one of the first carrier supply layer 205 and the second carrier supply layer 213 may be a p-doped layer, different from the above.

The bulk-doped carrier supply layer may be formed by uniformly distributing dopant (Si in case of n-doping) in the InAlAs layer. The delta-doped carrier supply layer may be implemented by forming a very thin Si (n-type dopant) or Be (p-type dopant) layer without an InAlAs layer in order to enhance the doping concentration greatly. In other words, a delta-doped layer may be formed by forming a thin layer with a dopant material.

Figure 3:
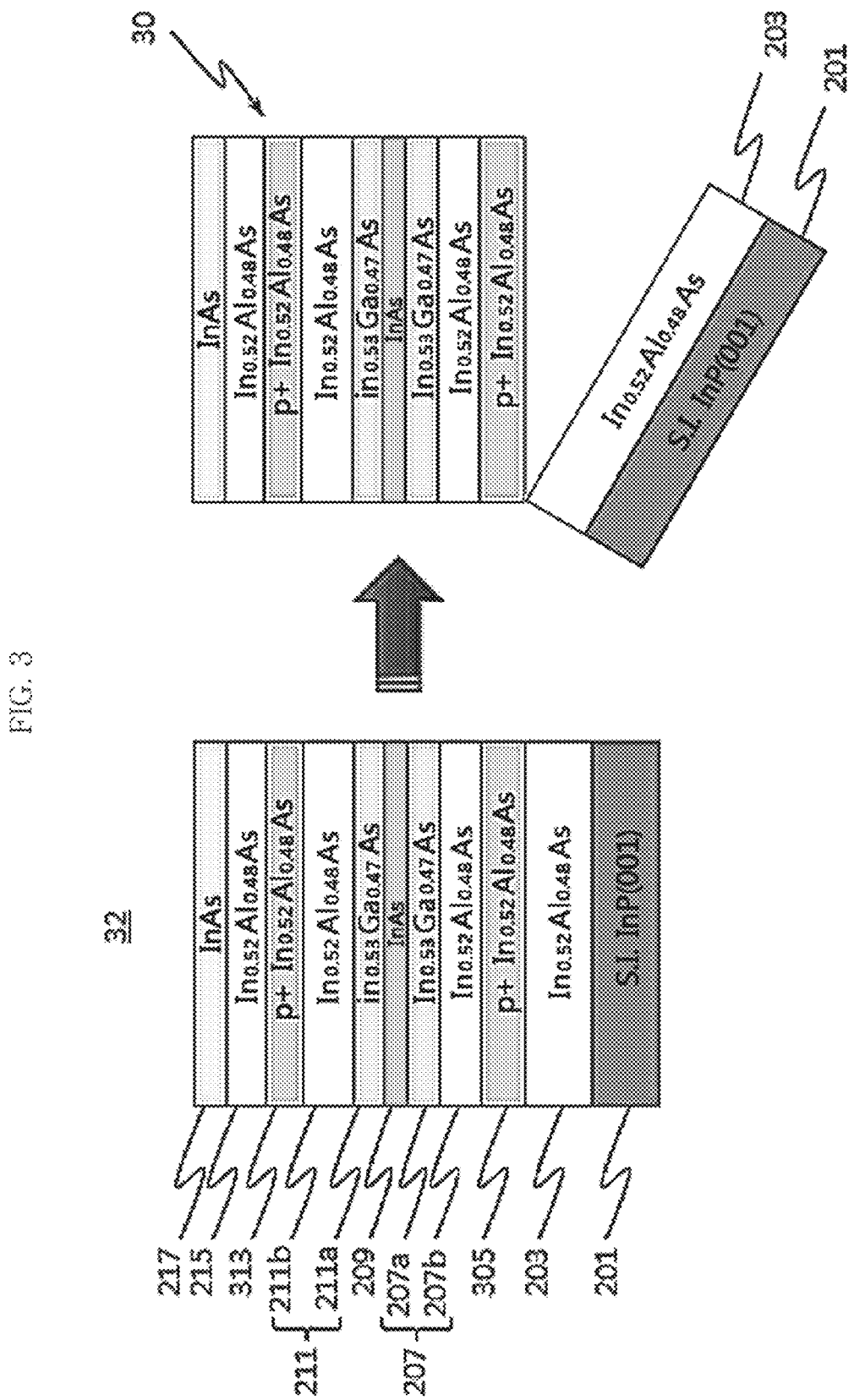
FIG. 3 is a schematic diagram for illustrating a process of manufacturing a second semiconductor element, included in the complementary logic device of FIG. 1.

FIG. 3 schematically illustrates a manufacturing process of the semiconductor device 30 depicted in FIG. 1. A left portion of FIG. 3 shows a preform 32 of the semiconductor device 30, prepared by means of a semiconductor process, and a right portion of FIG. 3 shows a process of separating the semiconductor device 30 from the preform 32. The manufacturing process of the semiconductor device 30 in FIG. 3 is just for illustration of the present disclosure, and the present disclosure is not limited thereto. Therefore, manufacturing process of the semiconductor device 30 in FIG. 3 may also be modified in various ways. Meanwhile, the semiconductor device 30 and the preform 32 of FIG. 3 are respectively similar to the semiconductor device 20 and the preform 22 of FIG. 2, and thus the like component is designated by the like reference symbol and not described in detail.

As shown in FIG. 3, in order to use the second semiconductor device 30 as a hole transfer passage, namely as a 2-dimension electron gas (2DHG), the first carrier supply layer 305 and the second carrier supply layer 313 made of p-doped InAlAs are used. The second semiconductor device 30 may be made using the carrier supply layers 305, 313. At this time, the first carrier supply layer 305 and the second carrier supply layer 313 may have different p-doping concentrations so that the channel layer 209 has a potential gradient. In other words, they should be fabricated to allow precession of the injected spin. The preform 32 of FIG. 3 may be fabricated so that any one of the first carrier supply layer 305 and the second carrier supply layer 313 is n-doped and the other is p-doped, similar to the preform 22 of FIG. 2. In addition, the first carrier supply layer 305 and the second carrier supply layer 313 may not always exist together, and a structure having just any one of them may also be used.

However, if the preform 22 of FIG. 2 and the preform 32 of FIG. 3 have the perfectly same structure formed with carrier supply layers doped in the same type at the same doping concentration, they have the same spin-orbit interaction constant and thus may not be fabricated into a complementary logic device. Therefore, preforms having channel layers with different potential gradients, which have different doping types of carrier supply layers, different doping concentrations, different locations or numbers of carrier supply layers or the like, should be used.

In an embodiment, if the first carrier supply layer and the second carrier supply layer of the first semiconductor device and the second semiconductor device have different doping types, different spin-orbit interaction constants may be provided. For example, it is assumed that the first carrier supply layer of the first semiconductor device is an n-doped layer, the second carrier supply layer of the first semiconductor device is a p-doped layer, the first carrier supply layer of the second semiconductor device is a p-doped layer, and the second carrier supply layer of the second semiconductor device is an n-doped layer. In this case, the first semiconductor device and the second semiconductor device may have different spin-orbit interaction constants. In addition, it is also possible that the first carrier supply layer and the second carrier supply layer of the first semiconductor device are n-doped layers, and the first carrier supply layer and the second carrier supply layer of the second semiconductor device are p-doped layers. In another example, it is also possible that the first carrier supply layer and the second carrier supply layer of the first semiconductor device are n-doped layers, the first carrier supply layer of the second semiconductor device is an n-doped layer, and the second carrier supply layer of the second semiconductor device is a p-doped layer. In this way, carrier supply layers having various and different doping types may be used in order to obtain spin-orbit interaction constants suitable for an environment of the channel.

In another embodiment, even if the first semiconductor device and the second semiconductor device use carrier supply layers of the same doping type, if any one of the first carrier supply layer and the second carrier supply layer uses a carrier supply layer of a different doping concentration, the first semiconductor device and the second semiconductor device may have different spin-orbit interaction constants. For example, even though the first carrier supply layer and the second carrier supply layer of the first semiconductor device and the second semiconductor device are n-doped layers, the first semiconductor device and the second semiconductor device may have different spin-orbit interaction constants if their carrier supply layers have different doping concentrations.

In another embodiment, even though the first carrier supply layer and the second carrier supply layer of the first semiconductor device and the second semiconductor device are n-doped layers, the first semiconductor device and the second semiconductor device may have different spin-orbit interaction constants if the second carrier supply layer of the first semiconductor device is delta-doped, the first carrier supply layer of the first semiconductor device is bulk-doped, and both the first carrier supply layer and the second carrier supply layer of the second semiconductor device are delta-doped. In other words, even when the first carrier supply layer and the second carrier supply layer of the semiconductor devices have different doping types, and also even when they have the same doping type but have different doping characteristics like bulk doping and delta doping, the semiconductor devices may also be used for a complementary logic device.

In another embodiment, if the first semiconductor device and the second semiconductor device have different numbers of carrier supply layers, they may be used since their spin-orbit interaction constants are different. For example, if the first semiconductor device has two carrier supply layers and the second semiconductor device has a single carrier supply layer, the first semiconductor device and the second semiconductor device may have different spin-orbit interaction constants.

In another embodiment, if the first semiconductor device and the second semiconductor device have carrier supply layers at different locations, they may be used since their spin-orbit interaction constants are different. For example, if the first semiconductor device has a carrier supply layer only at an upper portion of the channel and the second semiconductor device has a carrier supply layer only at a lower portion of the channel, the first semiconductor device and the second semiconductor device may have different spin-orbit interaction constants In another embodiment, if a thickness of the upper cladding layer of the first semiconductor device is different from a thickness of the upper cladding layer of the second semiconductor device or a thickness of the lower cladding layer of the first semiconductor device is different from a thickness of the lower cladding layer of the second semiconductor element, the first semiconductor device and the second semiconductor device may have different spin-orbit interaction constants.

In another embodiment, even though InAs is used for the channel layer in FIGS. 2 and 3, in each channel layer, any material selected from the group consisting of InAs, GaAs, InGaAs and InSb may be selected as a semiconductor material. If InAs is used for the channel layer of the first semiconductor device and InSb is used for the channel layer of the second semiconductor element, the first semiconductor device and the second semiconductor device may have different spin-orbit interaction constants. It is because the materials of these channel layers have inherent bandgaps and thus have different potential gradients.

By using the above embodiments, the preform 22 of the first semiconductor device is prepared at a substrate (hereinafter, a second substrate), separate from the substrate 10 (hereinafter, a first substrate) used when making the complementary logic device, and the preform 32 of the second semiconductor device is also prepared at a substrate (a third substrate), different from the first substrate. After that, the InAlAs buffer layer 203 is used as a sacrificial layer and separated from the second and third substrates, used for making preforms, by means of an epitaxial lift-off (ELO) technique, and then only the upper and lower cladding layers, the channel layer and the carrier supply layer are attached on the first substrate 10 side by side by means of wafer bonding.

A gate electrode and a ferromagnetic body serving as a source and a drain are disposed on two semiconductor devices having different spin-orbit interaction constants, which are arranged and transferred on the substrate 10 side by side, and are used commonly for the two semiconductor substrates.

Figure 4:
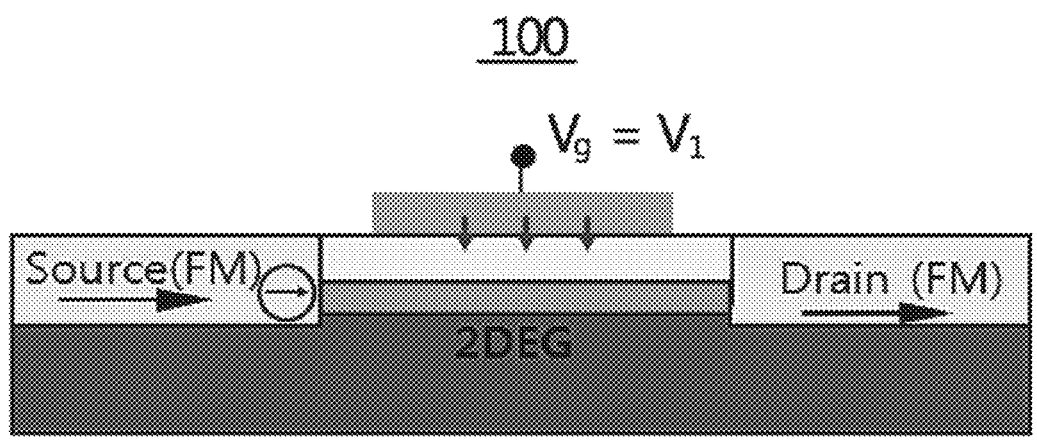
FIG. 4 is a schematic sectional view showing the complementary logic device of FIG. 1, taken along the line IV-IV.
Figure 4:
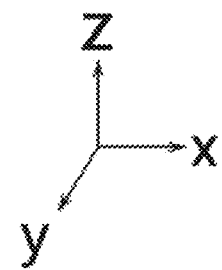

FIG. 4 schematically shows a sectional structure of the semiconductor complementary logic device 100, taken along the line of IV-IV of FIG. 1. An operation state of the semiconductor complementary logic device 100 as shown in FIG. 4 is just for illustration of the present disclosure, and the present disclosure is not limited thereto. Therefore, the operation state of the semiconductor complementary logic device 100 may be modified in different ways.

As shown in FIG. 4, the gate electrode 50 controls spinning according to a gate voltage (Vg=V1) applied thereto. In detail, since a spinning speed varies depending on the voltage applied to the gate electrode 50, when the spin rotates and moves from the source electrode 40 to the drain electrode 60, the direction of the spin reaching the drain electrode 60 may be controlled by means of the voltage applied to the gate electrode 50.

The semiconductor devices 20, 30 serve as a passage along which the spin moves from the source electrode 40 to the drain electrode 60, by allowing a current to flow between the semiconductor devices 20, 30 and the source electrode 40. A current flows from the source electrode 40 to the semiconductor devices 20, 30, and the spin with directivity injected to the source electrode 40 moves through the semiconductor devices 20, 30 to the drain electrode 60 by means of the flowing current. In other words, according to the current flowing from the source electrode 40 to the semiconductor devices 20, 30 and the voltage applied to the gate electrode 50, the spin rotates from the source electrode 40 to the drain electrode 60 and moves through the semiconductor devices 20, 30. Since the semiconductor devices 20, 30 intrinsically have channel layers with different potential gradients and thus have different spin-orbit interaction constants, the spins of the first semiconductor device and the second semiconductor device, which reach the drain electrode 60 with the same gate voltage, have different directions and thus are usable for the complementary logic device.

For example, if a spin in a single semiconductor device passing the channel layer rotates by 360 degrees and becomes parallel to a magnetization direction of the drain until being detected at the drain, the single semiconductor device turns on. If a spin in the other semiconductor device passing through the channel layer rotates by 180 or 540 degrees and becomes semi-parallel to the magnetization direction of the drain until being detected at the drain, the other semiconductor device turns off. Therefore, it is possible to operate a complementary logic device in which on/off states may be alternately switched using a single gate electrode.

While the exemplary embodiments have been shown and described, it will be understood by those skilled in the art that various changes in form and details may be made thereto without departing from the spirit and scope of the present disclosure as defined by the appended claims.

What is claimed is:

1. A complementary logic device, comprising:
   a substrate;
   a first semiconductor device located on the substrate and including a first channel layer with a two-dimensional electron gas structure (2DEG) or a two-dimensional hole gas structure (2DHG), a carrier supply layer for supplying a carrier to the channel layer, and an upper cladding layer and a lower cladding layer respectively located at upper and lower portions of the channel layer;

a second semiconductor device located on the substrate to be spaced apart from the first semiconductor device and including a second channel layer with a two-dimensional electron gas structure (2DEG) or a two-dimensional hole gas structure (2DHG), a carrier supply layer for supplying a carrier to the channel layer, and an upper cladding layer and a lower cladding layer respectively located at upper and lower portions of the channel layer;

a source electrode located on the first semiconductor device and the second semiconductor device and made of a ferromagnetic body;

a drain electrode located on the first semiconductor device and the second semiconductor device to be spaced apart from the source electrode and made of a ferromagnetic body; and a gate electrode located on the first semiconductor device and the second semiconductor device and located between the source electrode and the drain electrode so that a gate voltage is applied thereto to control a spin of electrons passing through the first channel layer and the second channel layer, wherein the first semiconductor device and the second semiconductor device have different spin-orbit interaction constants.

2. The complementary logic device according to claim 1, wherein the first semiconductor device and the second semiconductor device respectively include a first carrier supply layer located below the lower cladding layer to supply a carrier to the channel layer and a second carrier supply layer located on the upper cladding layer to supply a carrier to the channel layer, wherein the lower cladding layer includes a first lower cladding layer and a second lower cladding layer formed below the first lower cladding layer and having a greater bandgap than the first lower cladding layer, and wherein the upper cladding layer includes a first upper cladding layer and a second upper cladding layer formed on the first upper cladding layer and having a greater bandgap than the first upper cladding layer.

3. The complementary logic device according to claim 2, wherein a doping type of the first carrier supply layer of the first semiconductor device is different from a doping type of the first carrier supply layer of the second semiconductor element, or a doping type of the second carrier supply layer of the first semiconductor device is different from a doping type of the second carrier supply layer of the second semiconductor element.

4. The complementary logic device according to claim 2, wherein a doping concentration of the first carrier supply layer of the first semiconductor device is different from a doping concentration of the first carrier supply layer of the second semiconductor element, or a doping concentration of the second carrier supply layer of the first semiconductor device is different from a doping concentration of the second carrier supply layer of the second semiconductor element.

5. The complementary logic device according to claim 2, wherein a doping characteristic of the first carrier supply layer of the first semiconductor device is different from a doping characteristic of the first carrier supply layer of the second semiconductor element, or a doping characteristic of the second carrier supply layer of the first semiconductor device is different from a doping characteristic of the second carrier supply layer of the second semiconductor element.

6. The complementary logic device according to claim 1, wherein the first semiconductor device and the second semiconductor device respectively include one or more carrier supply layers, and wherein the first semiconductor device and the second semiconductor device include different numbers of carrier supply layers.

7. The complementary logic device according to claim 1, wherein the carrier supply layer of the first semiconductor device is located on the first channel layer, and the carrier supply layer of the second semiconductor device is located below the second channel layer.

8. The complementary logic device according to claim 1, wherein a thickness of the upper cladding layer of the first semiconductor device is different from a thickness of the upper cladding layer of the second semiconductor element, or a thickness of the lower cladding layer of the first semiconductor device is different from a thickness of the lower cladding layer of the second semiconductor element.

9. The complementary logic device according to claim 1, wherein the first channel layer and the second channel layer are made of a material selected from the group consisting of GaAs, InAs, InGaAs and InSb, and wherein the first channel layer and the second channel layer are made of different materials.

10. A method for manufacturing a complementary logic device, comprising:

Preparing a first substrate;

providing a first semiconductor device on the first substrate, the first semiconductor device including a first channel layer with a two-dimensional electron gas structure (2DEG) or a two-dimensional hole gas structure (2DHG), a carrier supply layer for supplying a carrier to the channel layer, and an upper cladding layer and a lower cladding layer respectively located at upper and lower portions of the channel layer;

providing a second semiconductor device on the first substrate to be spaced apart from the first semiconductor element, the second semiconductor device including a second channel layer with a two-dimensional electron gas structure (2DEG) or a two-dimensional hole gas structure (2DHG), a carrier supply layer for supplying a carrier to the channel layer, and an upper cladding layer and a lower cladding layer respectively located at upper and lower portions of the channel layer;

providing a source electrode on the first semiconductor device and the second semiconductor element, the source electrode being made of a ferromagnetic body;

providing a drain electrode on the first semiconductor device and the second semiconductor device to be spaced apart from the source electrode, the drain electrode being made of a ferromagnetic body; and providing a gate electrode between the source electrode and the drain electrode to be spaced apart from the source electrode and the drain electrode, wherein the first semiconductor device and the second semiconductor device have different spin-orbit interaction constants.

11. The method for manufacturing a complementary logic device according to claim 10, wherein the providing of a first semiconductor device includes:

forming the first semiconductor device on a second substrate; and separating the first semiconductor device from the second substrate and transferring onto the first substrate.

12. The method for manufacturing a complementary logic device according to claim 10,
   wherein the providing of a second semiconductor device includes:
   forming the second semiconductor device on a third substrate; and
   separating the second semiconductor device from the third substrate and transferring onto the first substrate.

13. The method for manufacturing a complementary logic device according to claim 10,
   wherein the first channel layer and the second channel layer are made of a material selected from the group consisting of GaAs, InAs, InGaAs and InSb, and
   wherein the first channel layer and the second channel layer are made of different materials.

* * * * *